US006803797B2

(12) United States Patent
Park

(10) Patent No.: US 6,803,797 B2
(45) Date of Patent: Oct. 12, 2004

(54) SYSTEM AND METHOD FOR EXTENDING DELAY-LOCKED LOOP FREQUENCY APPLICATION RANGE

(75) Inventor: Chin S. Park, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/355,200

(22) Filed: Jan. 31, 2003

(65) Prior Publication Data

US 2004/0150444 A1 Aug. 5, 2004

(51) Int. Cl.⁷ .................................................. H03L 7/06
(52) U.S. Cl. .................................... 327/158; 327/156
(58) Field of Search ............................. 327/156, 158, 327/161, 147, 149, 153, 157

(56) References Cited

U.S. PATENT DOCUMENTS 5,223,755 A * 6/1993 Richley ..................... 327/158
5,642,082 A * 6/1997 Jefferson .................... 331/25
6,366,146 B2 * 4/2002 Fredriksson ................ 327/156
6,667,643 B2 * 12/2003 Ko ............................. 327/158

* cited by examiner

Primary Examiner—Dinh T. Le
(74) Attorney, Agent, or Firm—Fleshner & Kim, LLP

(57) ABSTRACT

A delay-locked loop includes an override controller for controlling the frequency range within which the loop operates. The override controller controls this range based on the output of a detector which compares a phase error between input and output frequency signals to a predetermined range. If the phase error lies outside this range, the controller disables a phase detector to allow the input signal delay to be adjusted based on the output of the range detector. Delay adjustments may be iteratively performed until the range detector determines that the phase error lies within the predetermined range. At this point, the override controller activates the phase detector, and the phase detector is allowed to control further delay adjustments until the phase error is eliminated or reduced, for example, to within tolerable limits. By setting the phase-error range, the delay-locked loop maybe customized to satisfy the requirements of a variety of applications and further maybe set to surpass the operational limitations of conventional loops.

28 Claims, 18 Drawing Sheets

WITH K* 360 DEGREE DELAY
WHERE K = 0,1,2,...

WITH K* 360 DEGREE DELAY
WHERE K = 0,1,2,...

EACH DELAY QUADRANT BLOCK IS COMPOSED OF SIX DIFFERENTIAL DELAY ELEMENTS

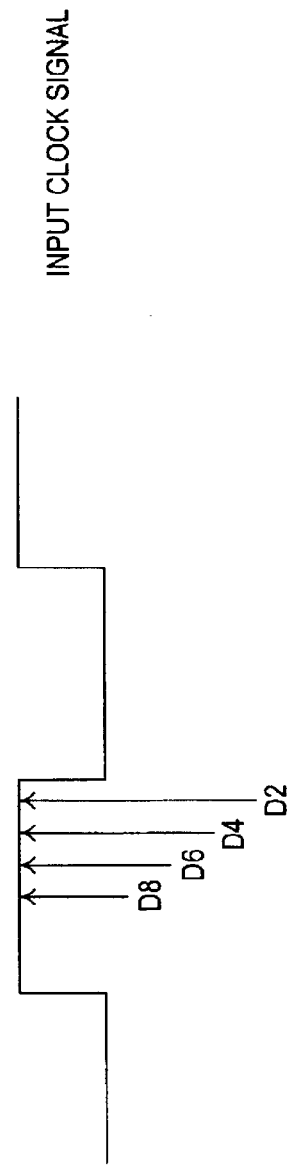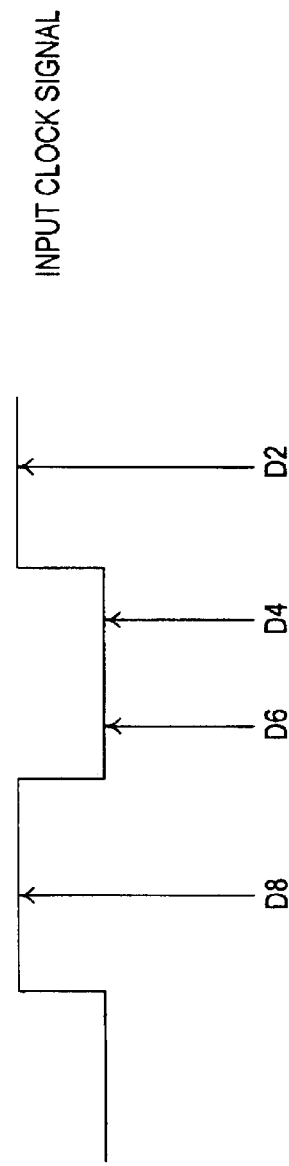

SYSTEM AND METHOD FOR EXTENDING DELAY-LOCKED LOOP FREQUENCY APPLICATION RANGE

BACKGROUND OF THE INVENTION

1. Field of the Invention

This invention generally relates to generating frequency signals, and more particularly to a system and method for controlling the frequency range of a delay-locked loop circuit.

2. Description of the Related Art

Delay-Locked Loop(DLL) circuits are desirable because of their ability to produce a stable output frequency synchronized with the period of an input reference signal. These circuits are most commonly used to generate clock signals for controlling the speed and operation of microprocessor systems and timing signals for transferring data in various data storage applications.

FIG. 1 shows a conventional delay-locked loop circuit which includes a phase detector 1, a control generator 2, and a programmable delay circuit 3, which is initially set to some arbitrary delay and thereafter is controlled by the control generator. In operation, the phase detector outputs a signal corresponding to a difference in phase between an input clock signal CKin and an output clock signal CKdly. The difference signal is input into the control generator and the generator responds by outputting a control signal to the delay circuit. The delay circuit then delays the input clock signal by an amount which reduces the phase difference between the input and output clock signals. Because the phase detector continuously compares the input and output clock signal phases, the output of the delay-locked loop is assured of being locked onto the period of the input clock signal.

Structurally, the phase detector includes a circuit which generates Up or Down signals for increasing or decreasing the delay based on a polarity of the phase difference between the clock signals. The control generator includes an integrator for integrating the phase-difference, a loop filter for filtering the output of the integrator to provide stabilizing control, and a signal-generation circuit for generating a control signal for setting the amount of delay in the delay circuit. Finally, the delay circuit includes a chain of delay elements which delay the input clock signal by an amount which corresponds to the voltage of the control signal output from the control generator.

While conventional delay-locked loop circuits have proven reliable for purposes of generating an output frequency signal having stable synchronized period, they are not without drawbacks. One significant drawback relates to their inability to accurately determine the extent of delay between the input and output clock signals in terms of numbers of clock periods. Put differently, the phase detector in conventional DLL circuits cannot determine, for example, whether a detected phase difference resulted from the input and output clock signals being 90 degrees out-of-phase or 450 degrees out of phase. This situation is depicted in FIG. 2, where the difference between the leading edges of the input and output clock signals measures one clock period (360°) plus 90 degrees.

When this situation occurs, the delay unit maybe controlled by the control generator to place the input and output clock signals in phase with one another, but in so doing the output clock signal may differ from the input clock signal by one or more clock periods. This situation is depicted in FIG. 3, where the output clock signal CKdly is separated an integer number K clock periods from the input clock signal. Here, it is clear that the output clock signal CKdly is indistinguishable in appearance whether it is separated from the input clock signal by one clock period or multiple clock periods. As a result, conventional DLL circuits are susceptible to operating outside their effective operating frequency ranges, which results in a substantial degradation in performance. For example, the input clock signal maybe delayed by an improper amount and as a result significant phase error may persist between the input and output clock signals. This situation may be more clearly understood as follows.

Because the phase detector in a conventional DLL circuit cannot determine whether the delay between the input clock signal and output clock signal spans across multiple clock periods, its operating frequency range must necessarily be limited in order to prevent this condition from occurring. (This condition maybe referred to as an out-of-bounds condition.) Put differently, to prevent the DLL circuit from locking on to multiple clock periods, the circuit must be designed to operate in a narrow frequency range. As a result, use of conventional DLL circuits must be limited to only those applications which operate within the DLL operational frequency range.

BRIEF DESCRIPTION OF THE DRAWINGS

FIG. 15A is a timing diagram showing an example of phase-delay information input into the slow-fast detector in a case where phase error is not excessive, and FIG. 15B is a timing diagram showing an example of phase-delay information input into the slow-fast detector in a case where phase error is excessive.

DESCRIPTION OF THE PREFERRED EMBODIMENTS

The present invention is a delay-locked loop circuit which detects whether an output frequency signal lies outside a predetermined phase-error range relative to the input frequency signal, and then adjusts a delay controller to allow the circuit to operate in an expanded frequency range for the input frequency signal. The predetermined phase-error range maybe measured relative to a period of the input frequency signal, and in accordance with at least one embodiment corresponds to the limited operational frequency (or phase-error) range of a conventional DLL circuit. Alternatively, this range may include other frequencies (or phase-errors) which are not defined or otherwise limited by conventional DLL operational ranges. The expanded frequency range maybe determined, for example, by a particular application to which the DLL circuit of the present invention is to be applied, although other factors may be taken into consideration for these purposes.

By operating in an expanded frequency range, the delay-locked loop circuit of the present invention maybe used for applications which conventional DLL circuits have proven unsuitable. These include but are not limited to clock generators which operate in any one of a variety of low-power modes as well as certain testing applications. More specifically, the DLL of the present invention may be used to test devices which operate at frequencies which lie outside the capabilities of conventional DLLs. For example, conventional DLLs typically operate at 400 MHz and thus are able support clock-frequencies of between 250 MHz and 550 MHz. Chips operating at lower frequencies (e.g., 100 MHz) therefore cannot be tested by or otherwise operate with conventional DLLs. By increasing its operating range beyond that of conventional DLLs, the DLL of the present invention may advantageously be used to test chips which operate in an extended frequency range, which in the foregoing example may include the 100 MHz range.

As will be explained in greater detail, this enhanced performance may be achieved by detecting excess phase error (e.g., phase error exceeding one or more clock periods) between input and output frequency signals and then adjusting the delay of the input frequency signal in order to allow the circuit to operate in an expanded range. The present invention is also a method for controlling the operational frequency range of a delay-locked loop circuit, as well as a processing system with includes a DLL of this type. A description of the various embodiments of the invention now follows.

Figure 4:
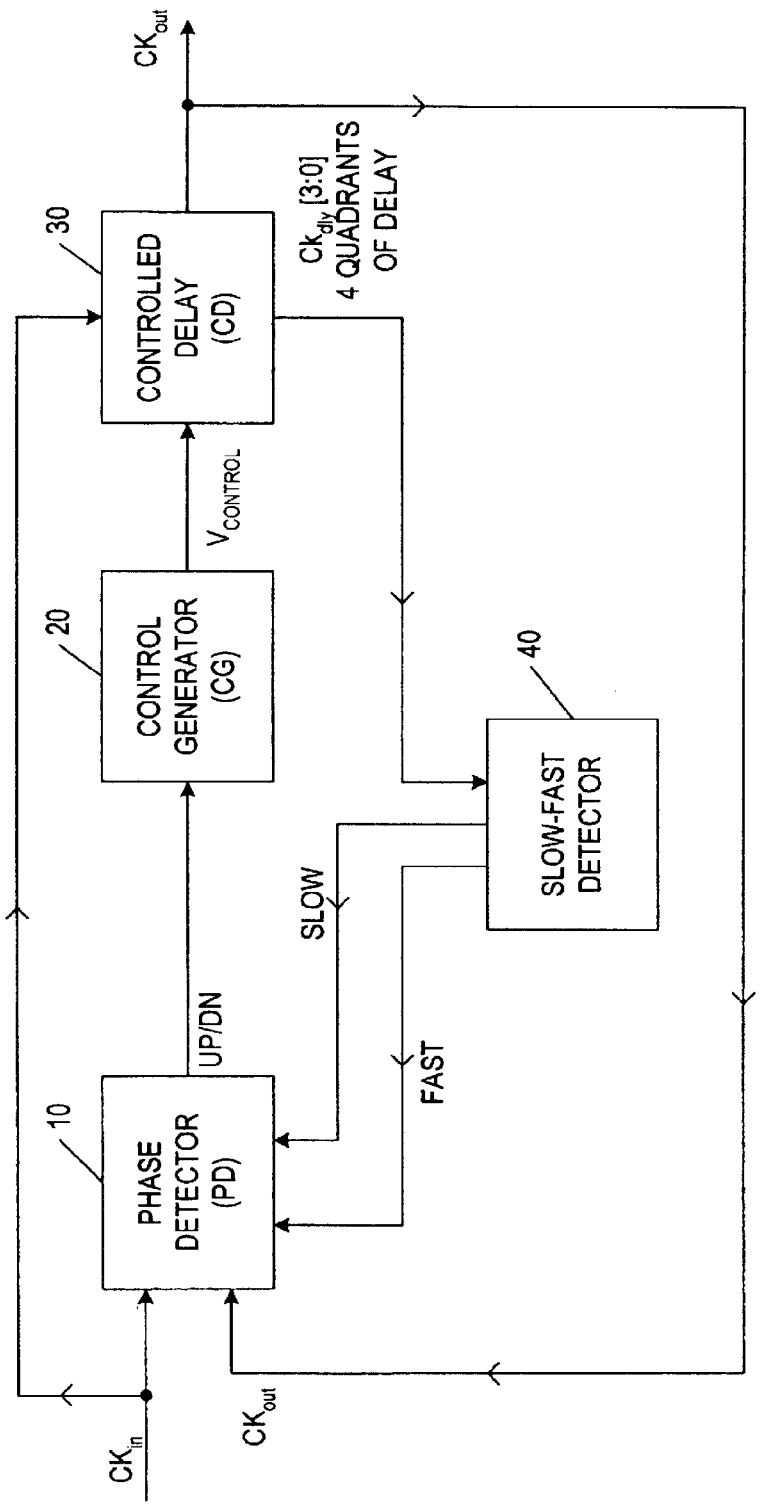
FIG. 4 is a functional block diagram showing a delay-locked loop circuit in accordance with one embodiment of the present invention.

FIG. 4 shows a delay-locked loop circuit in accordance with one embodiment of the present invention. This circuit includes a phase detector 10, a delay control generator 20, a programmable delay unit 30, and a slow-fast detector 40. The phase detector detects a difference in phase between an input frequency signal and an output frequency signal, which in this case corresponds to a delayed signal output from the delay unit. When excess phase error is not detected, a signal indicative of the phase difference is input into the control generator, and the control generator outputs a signal $V_{control}$ to delay unit 30 for delaying the input frequency signal by an amount which reduces or eliminates the detected phase difference. When excess phase error is detected, an override control circuit (discussed in greater detail below) modifies the output of the phase detector to cause the control generator to delay the input frequency signal until the phase error is brought to within a range not considered to be excessive. Normal operation of the phase detector then resumes to further reduce or eliminate the phase error.

In order to program the delay unit to a desired delay, the control generator may include a charge pump for generating the $V_{control}$ signal, a loop filter for stability control, and a signal-generation circuit for outputting a control signal for setting the delay in the delay until. In FIG. 4, the input frequency signal and output (or delayed) frequency signal are illustratively shown as clock signals $CK_{in}$ and $C_{out}$. Those skilled in the art can appreciate, however, that the invention may be applied to any type of frequency signal.

The programmable delay unit 30 is preferably a voltage-controlled chain of delay elements, each of which delays the phase of the input clock signal by an amount determined by the period of the input clock signal. For example, if unit 30 includes N delay elements, the delay imposed by each element may be equal to the input clock period divided by N once the loop is locked. (While this arrangement is preferable, those skilled in the art can appreciate that the delay elements may impose different delays, and even unequal delays if desired.) By selectively turning on and off combinations of these elements in accordance with the control signal $V_{control}$ output from the control generator, a desired phase delay maybe achieved which reduces the phase difference between input and output frequency signals. In accordance with the present invention, the programmable delay unit may also include a circuit for generating a phase-delay indication signal $CK_{delay}$ which indicates an amount of phase delay generated by the delay elements in unit 30.

Figure 1:
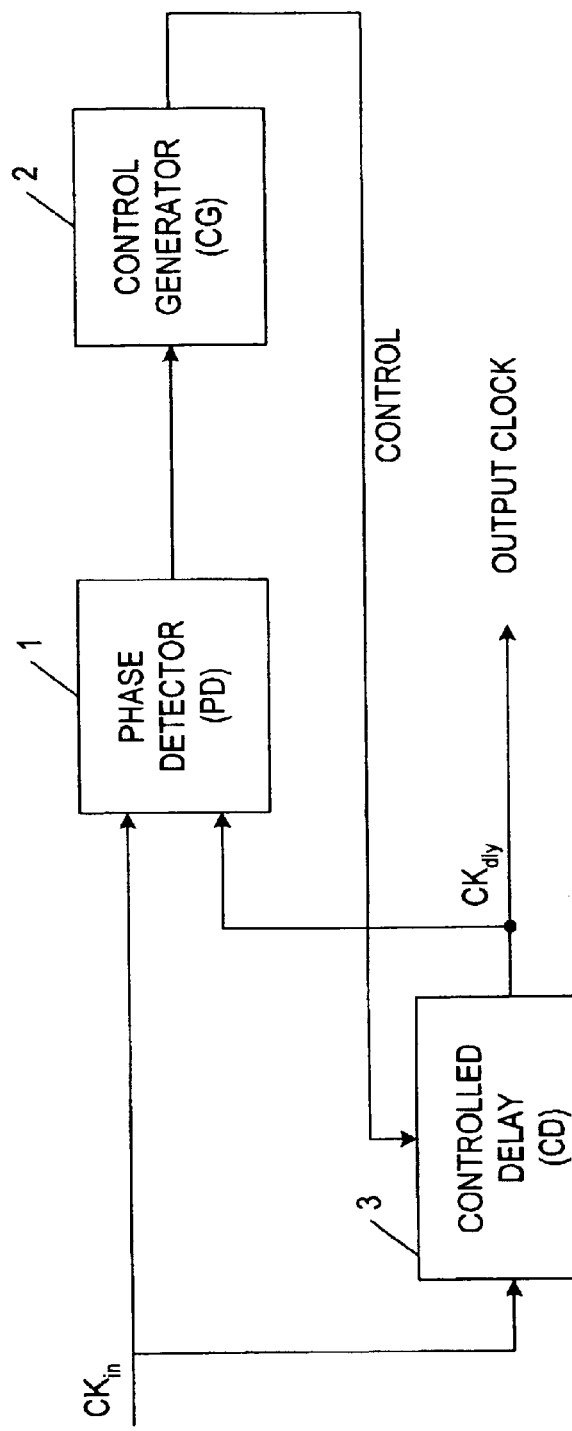
FIG. 1 is a diagram showing a conventional delay-locked loop circuit which operates within a limited frequency range.
Figure 2:
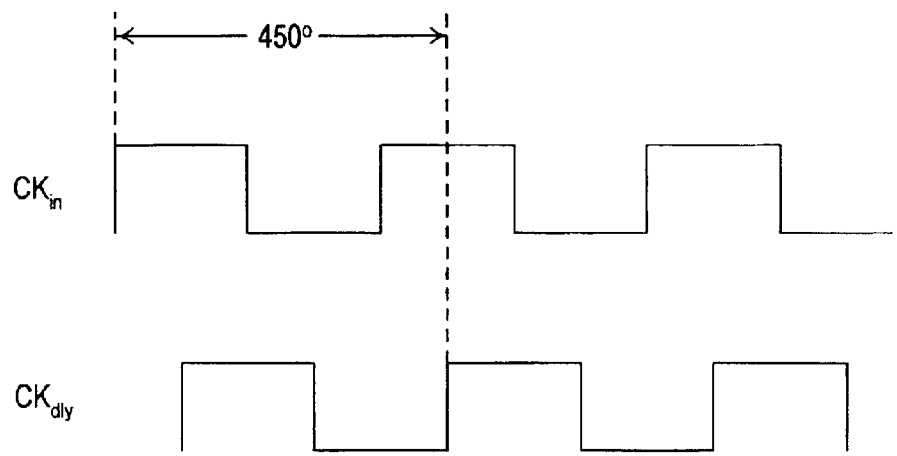
FIG. 2 is a timing diagram showing a phase difference between input and output clock signals measured from leading edges of these signals.
Figure 3:
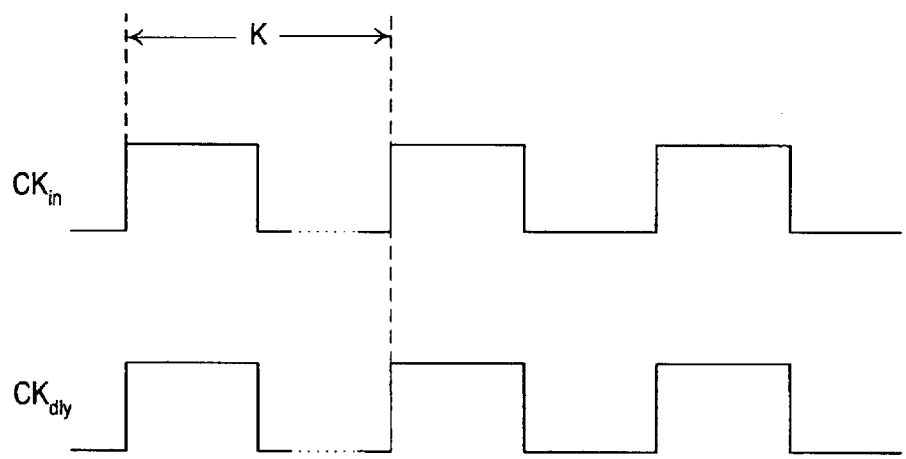
FIG. 3 is a timing diagram showing a phase difference between input and output clock signals which spans across multiple clock periods.

Generation of this phase-delay indication signal provides feedback information which in at least one way allows the present invention to out perform conventional DLL circuits. As previously discussed with reference to FIGS. 1–3, the phase detector in a conventional DLL circuit is unable to detect whether the delay between input and output clock signals lie within one period of the input clock signal or more than one clock period. Thus, an output (or delayed) clock signal which lies within an operating frequency range of the DLL circuit (e.g., within one clock period of the input clock signal) will look identical to an output clock signal which corresponds to an out-of-bounds (or excessive phase-error) condition, e.g., one where the output clock signal is separated from the input clock signal by one or more (K) clock periods. Consequently, conventional phase detectors cannot determine whether the output clock signal is actually in phase with the period of the input clock signal, because, for example, the case of whether the phase error corresponds to 90 degrees or 450 degrees cannot be distinguished. As a result, the phase detector in conventional DLL circuits may erroneously conclude that the input and output clock signals are in phase when in reality they may be separated by one or more integer multiples of 360 degrees, or equivalently one or more integer multiples of the input clock signal period. Conventional DLL circuits will therefore not be able to take the corrective action required to prevent malfunction under these circumstances.

The present invention overcomes these drawbacks by using a programmable delay unit 30 which generates signals indicative of the total phase delay applied to an input clock signal, a slow-fast detector 40 which detects whether an out-of-bounds (or excessive phase-error) condition exists based on delay indication information fed back from the delay unit, and an override control circuit which modifies operation of the phase detector when such a condition is detected. Through these features, the DLL circuit of the present invention is able operate within a greater range of frequencies than conventional DLL circuits, which range may be limited, for example, only by the operating range of the delay elements. Operation of the slow-fast detector will now be described.

The slow-fast detector 40 receives the phase-delay indication signal $CLK_{delay}$ from the programmable delay unit and determines whether the output frequency signal has been delayed by an amount which lies outside a predetermined delay range with respect to the input clock frequency. This range preferably corresponds to a delay measured in one or more periods or fractions of periods of the input clock signal. The range may also be set based on a duty cycle of the input clock signal which, for example, lies between 25% and 75%.

As an example, the delay range may be set based on the inherent limitations of the phase detector. One such phase detector is known to be limited to within an operational range of between $\frac{2}{3}$ P to 2 P for a 50% duty cycle, where P corresponds to one period of the input clock signal. While this range maybe preferable for use in at least one embodiment described herein, those skilled in the art can appreciate that other delay ranges maybe used to define the predetermined delay range of the present invention, including those not defined by or otherwise associated with the operational ranges of conventional DLL circuits.

Figure 5:
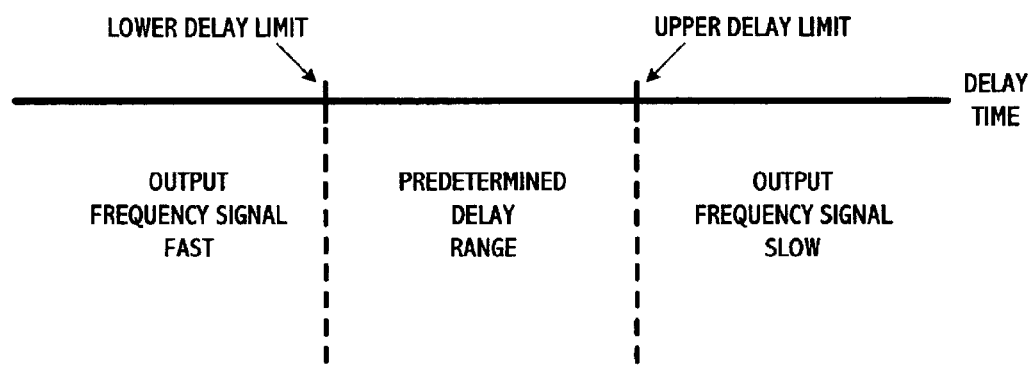
FIG. 5 is a timing diagram showing an example of a predetermined delay range which may be used as a basis for generating fast and slow detection signals for controlling an effective operational frequency range of the delay-locked loop of the present invention.

If the phase delay of the output frequency signal $CK_{out}$ lies outside the predetermined delay range, the slow-fast detector outputs a signal indicative of this so-called out-of-bounds (or excessive phase-error) condition. This maybe accomplished in one of several ways. For example, if the output frequency signal exceeds an upper limit of this range, detector 40 may conclude that the delay in unit 30 is too large and output a slow detection signal to the phase detector along signal line 81. Conversely, if the output frequency signal falls short of a lower limit of the predetermined delay range, detector 40 may conclude that the delay in unit 30 is too small and output a fast detection signal to the phase detector along signal line 82. This situation is illustratively shown in the timing diagram of FIG. 5. If desired, the slow-fast detector maybe included within the phase detector. If so, the slow-fast detector and phase detector may be incorporated onto a single chip although this is not necessary.

The override control circuit modifies operation of the phase detector to allow the DLL of the present invention to operate in an expanded frequency range, relative to conventional DLLs, based on the fast and slow detection signals output from detector 40. The override control performed in accordance with the present invention may be accomplished as follows.

Figure 6:
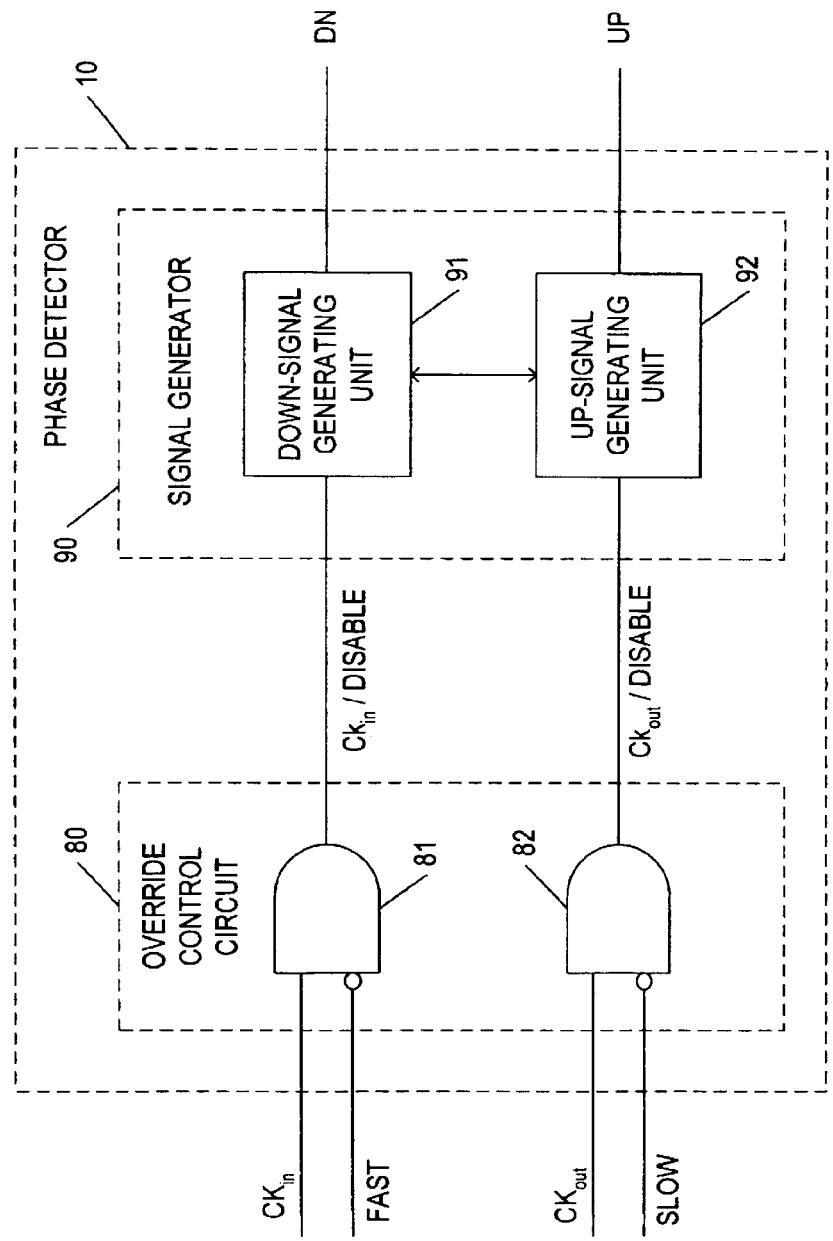
FIG. 6 is a block diagram showing a more detailed view of a phase detector including an override control circuit in accordance with one embodiment of the present invention.

FIG. 6 shows an example of an override control circuit of the present invention. This circuit, 80, includes a first logic gate 81 which receives as inputs the input clock signal $CK_{in}$ and the fast detection signal, and a second logic gate 82 which receives as inputs the output (or delayed) clock signal $CK_{out}$ and the slow detection signal. The logic gates are shown as AND gates but those skilled in the art can appreciate that other logic maybe used consistent with the override control of the present invention. Furthermore, in the figure, the override control circuit is shown as being included within phase detector 10. Those skilled in the art can appreciate that the override controller may alternatively be external to a chip containing the phase detector. It is further emphasized that the specific structure of the override controller in FIG. 6 is merely illustrative of the invention, as the invention contemplates use of other circuit designs provided those elements retain the functionality of the override controller described herein.

The override control circuit 80 overrides operation of the phase detector when one of the fast detection signal and slow detection signal is output from the slow-fast detector. This override control is preferably accomplished by disabling the comparison function normally performed for the input and output clock signals when no excessive phase-error is detected, and then generating an Up signal or Down signal based on the fast or slow detection signal to bring the phase error to within range which does not correspond to an excessive phase-error condition. If one adjustment in phase performed by the delay unit does not remove the out-of-bounds condition, the Up or Down signal from the override control circuit maybe continuously applied until this condition is removed. A more detailed discussion of the operation of the override control circuit now follows.

When a fast detection signal is output, the phase delay between the input and output clock signals is below the lower limit of the predetermined delay range defining the excessive phase-error condition. This signifies that the delay is too small. Under these circumstances, the delay in the programmable delay unit must be increased. This maybe accomplished in the following manner. First, the fast detection signal corresponding, for example, to a logical 1 is input into logic gate 81 of the override control circuit. The value of this signal is inverted to a value of zero, which causes a logical zero to be input into the down-signal generating unit 91 of of signal generator 90. Inputting a value of zero into the unit 91 causes the effective input clock phase of this unit to become frozen. At the same time, the logical value of the slow detection signal is zero. This value is inverted by gate 82, which causes the output (or delayed) clock signal $CK_{out}$ to be ahead of the phase compared with the port from $CK_{in}$. As a result, up-signal generating unit 92 of the signal generator outputs an Up signal to control generator 30, thereby causing an increase in the amount of delay imposed in the programmable delay unit. As long as the Up signal is output, the control generator will continue to increase a delay in the programmable delay unit until the excessive phase-error condition is detected as being removed by the slow-fast detector. In at least one embodiment of the invention, signal-generator 90 maybe a conventional phase detector.

When a slow detection signal is output, the phase delay between the input and output clock signals is above the upper limit of the predetermined delay range, signifying that the delay is too large. Under these circumstances, the delay in the programmable delay unit must be decreased. This may be accomplished as follows. First, the slow detection signal corresponding, for example, to a logical 1 is input into logic gate 82 of the override control circuit. The value of this signal is inverted to a value of zero, which causes a logical zero to be input into the up-signal generating unit 92. Inputting a value of zero into unit 92 causes the effective clock phase of this unit to become frozen. At the same time, the logical value of the fast detection signal is zero. This value is inverted by gate 81, which causes the input clock signal $CK_{in}$ to be ahead of the phase compared with the port from $CK_{out}$. As a result, down-signal generating unit 91 outputs a down signal to control generator 30, thereby causing an increase in the amount of delay imposed in the programmable delay unit. As long as the Down signal is output, the control generator will continue to set a delay in the programmable delay unit until the excessive phase-error condition is detected as being removed by the slow-fast detector.

In either case above, the delay set in the delay unit corresponds to the control voltage output from the control generator. More specifically, the Up or Down signal may be asserted for as long as the fast or slow signal is asserted and until the internal state of the phase detector is reset by the input clock signals. This may occur, for example, at falling edges of the lagging one of the two input clock signals of the phase detector. The control voltage used to set the delay in the delay unit may therefore depend on an integration of the Up and Down signal, and thus may be dependent on the cumulative duration of the control pulse.

In view of the foregoing description, it is therefore clear that the phase detector of the present invention operates differently depending upon whether the phase delay between the input and output clock signals lie outside the predetermined delay range. When outside of this range, the override control circuit disables normal operation of the phase detector, i.e., the comparison between the input and output clock signals that is normally performed is prevented. Instead, the override control circuit causes the phase detector to output one of an Up signal or Down signal based on the output of the slow-fast detector. The control generator increases or decreases the delay in the delay unit based on the Up or Down signal, and a newly delayed clock signal is output. The slow-fast detector then performs a second comparison to determine whether the phase delay between the new output clock signal and the input clock signal is still outside the predetermined range. If so, override control is performed in a similar manner until the slow-fast detector detects that the phase difference lies within the predetermined range.

At this point, the override control circuit of the present invention allows the phase detector to transition to a normal operating mode. More specifically, when the phase difference measured by the slow-fast detector detects that the phase difference between the input and output clock signals lies within the predetermined range, the slow and fast detection signals both assume logical values of 0. As a result, the override control circuit passes the input and output clock signals $CK_{in}$ and $CK_{out}$ clock signals to the signal generator, and the signal-generating units 90 and 91 cooperate in a conventional manner to generate Up or Down signals based on a comparison of the clock signals.

The DLL circuit of the present invention thus represents a significant improvement in the art, especially when compared with the operation of conventional DLL circuits. Through the fast-slow detector, the present invention is able to detect, for example, whether the phase error between input and output clock signals exceeds a range which limits the proper operation of a conventional DLL circuit. When such a condition is detected, the override control circuit modifies operation of the phase detector to increase or decrease the delay of the input clock signal until the phase error lies within the delay range which a conventional phase detector can accommodate. At this point, the override control circuit returns operation of the phase detector to conventional operation. Thus, the DLL circuit of the present invention is able to operate within an enhanced operational frequency range and thus is suitable for use in a broader range of applications.

Moreover, it is noted that while the predetermined delay range used by the fast-slow detector to detect an excessive phase-error condition may, in one advantageous embodiment, be determined based on the operational range of a conventional phase detector, those skilled in the art can appreciate that the DLL circuit of the present invention is by no means limited to this range. On the contrary, the delay range maybe delimited by values unrelated to the performance limitations of conventional DLLs. For example, the delay range defining the excessive phase-error condition may be determined based on the specific application to which the DLL circuit of the present invention is applied. Furthermore, the delay range may not be related in any way to an excessive phase-error condition but rather may correspond to a range which defines some other condition of interest. For example, one particular application may require that a certain phase-error range be avoided in order to ensure a preferred or optimum level of performance. This phase-error range may be used as a basis for generating the fast and slow detection signals in the slow-fast detector and thus for defining the conditions under which override control is effected in order to synchronize the output frequency signal to the period of the input frequency signal.

Figure 7:
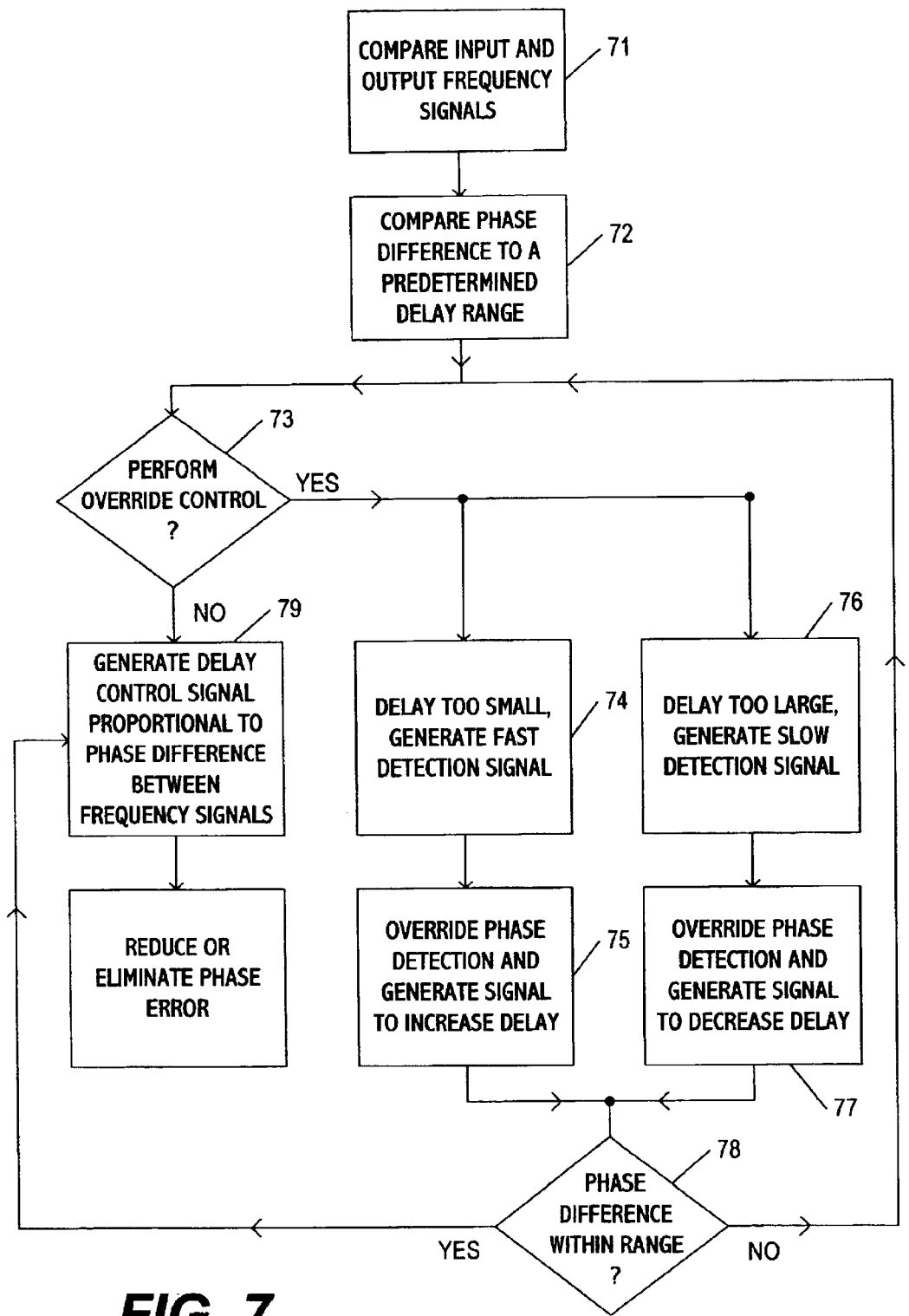
FIG. 7 is a flow diagram showing steps included in a method for controlling the frequency range of a delay-locked loop in accordance with one embodiment of the present invention.

Operation of a delay-locked loop in accordance with the foregoing embodiment of the present invention will now be described with reference to FIG. 7, which may simultaneously be referenced for a discussion of steps included in one embodiment of a method of the present invention for controlling the frequency range of a delay-locked loop.

In an initial step, an input clock signal $CK_{in}$ is received in a phase detector and compared with an output clock signal $CK_{out}$, which maybe generated based on some arbitrary or default delay set in a programmable delay unit. (Block 71).

In a next step, the phase difference (or the delay) between the input and output clock signal is compared to a predetermined delay range as previously defined. (Block 72). A determination is then made as to whether to effect override control with respect to the output of the phase detector. (Block 73).

If the phase difference lies outside the delay range and it is determined that the delay of the output clock signal is too small, a fast detection signal is output. (Block 74). Operation of the phase detector is then overridden, thereby causing the phase detector to output an Up signal to increase the input clock signal delay. (Block 75). On the other hand, if the delay of the output clock signal is too large, a slow detection signal is output. (Block 76). Operation of the phase detector is then overridden, thereby causing the phase detector to output a Down signal decrease the input clock signal delay. (Block 77).

Subsequent phase comparisons between the input and newly generated output clock signals may then be iteratively performed until it is determined that the phase difference between the clock signals corresponds to a delay which lies within the predetermined delay range. (Block 78). At this point, override control is disabled and the phase detector generates Up or Down signals proportional to the phase difference between the input and output clock signals. (Block 79).

If in Block 73, it is determined that the phase difference between the input and output clock signals corresponds to a delay which lies within the predetermined delay range, the phase detector generates Up or Down signals proportional to the phase difference between the input and output clock signals. (Block 79).

Figure 8A:
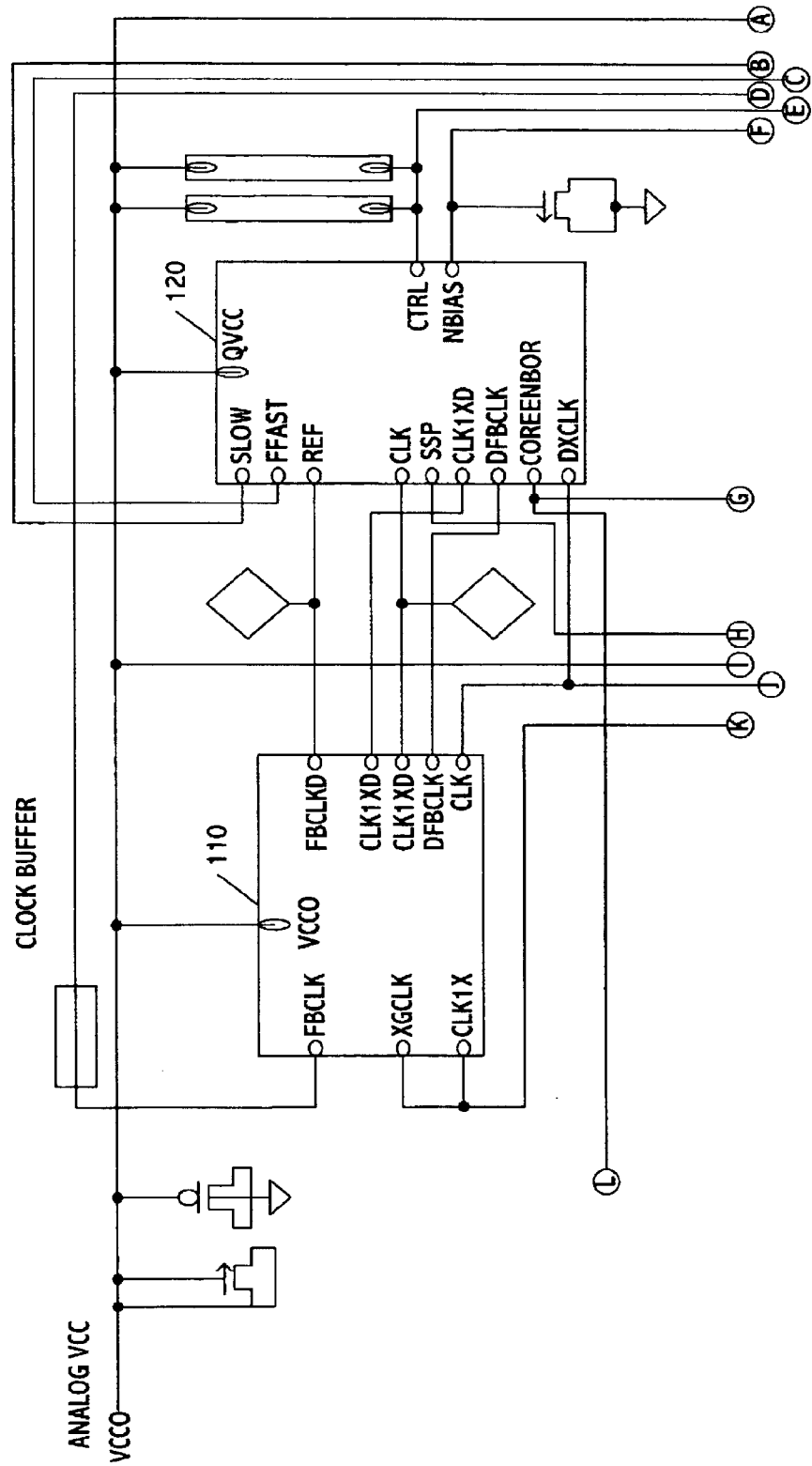
FIGS. 8(a) and 8(b) are diagrams showing respective portions of a digital implementation of a delay-locked loop in accordance with one embodiment of the present invention, which in this case forms a 2× clock generator.
Figure 8B:
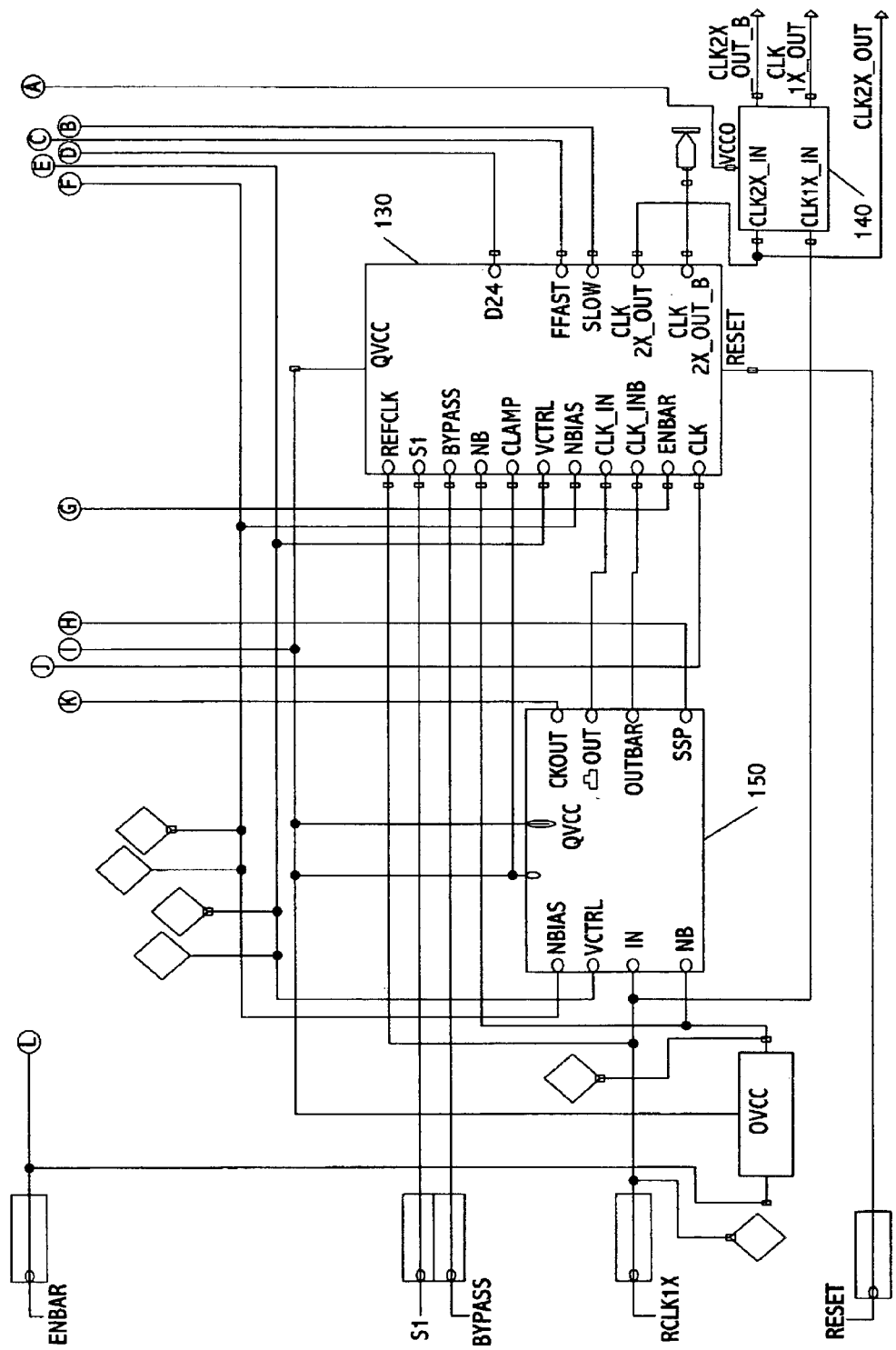

FIG. 8(a) and FIG. 8(b) show another embodiment of the delay-locked loop circuit of the present invention. In this embodiment, the frequency signals correspond to clock signals and the detectors and controllers are implemented using digital circuits. Operation of these circuits were simulated in a circuit simulator and the elements of the invention shown are based on a computerized representation of this simulation. As shown, the DLL circuit is implemented as a 2× clock generator which includes a block 110 having a clock buffer, a block 120 having a conventional phase detector, and control generator (charge pump, loop detector, etc.), a block 130 having a slow-fast detector, 2× clock shaping circuits, and a programmable delay controller in the form of a controlled delay loop, and a block 140 having 2× clock buffer.

In this example, the 2× clock generator is understood to include a clock multiplier, e.g., one where if the input of the clock generator is 200 MHz the output is 400 MHz with a 50% duty cycle. Also, a block 150 includes an optional digital-to-analog level shifter with a 90-degree shift included between a clock input terminal and the clock buffer. This circuit maybe used when the delay elements are analog circuits. In this case, the inputs and outputs of the circuit may not conform to digital values, e.g., a power rail voltage of VCC for a logical 1 and a ground potential for a logical 0. The input clock signal, however, is a digital signal. Thus, the digital-to-analog level shifter may be included to convert the digital input clock signal to an analog signal level for the delay elements. The analog signals output from the delay elements may be converted to digital signals, for example, by a high-voltage gain inverter.

Many of the chips in this circuit have been designed to accommodate multiple features of the DLL circuit of the present invention in order to, for example, save space and implement the invention is a more economical manner. Those skilled in the art can appreciate, however, that if desired each feature of the invention may be implemented on a separate chip or conversely the entire DLL circuit of the present invention may be designed onto a single chip. Also, while digital implementations of the invention are possible, those skilled in the art can appreciate that all or a portion of the DLL circuit of the invention may be implemented using analog technology.

Figure 9A:
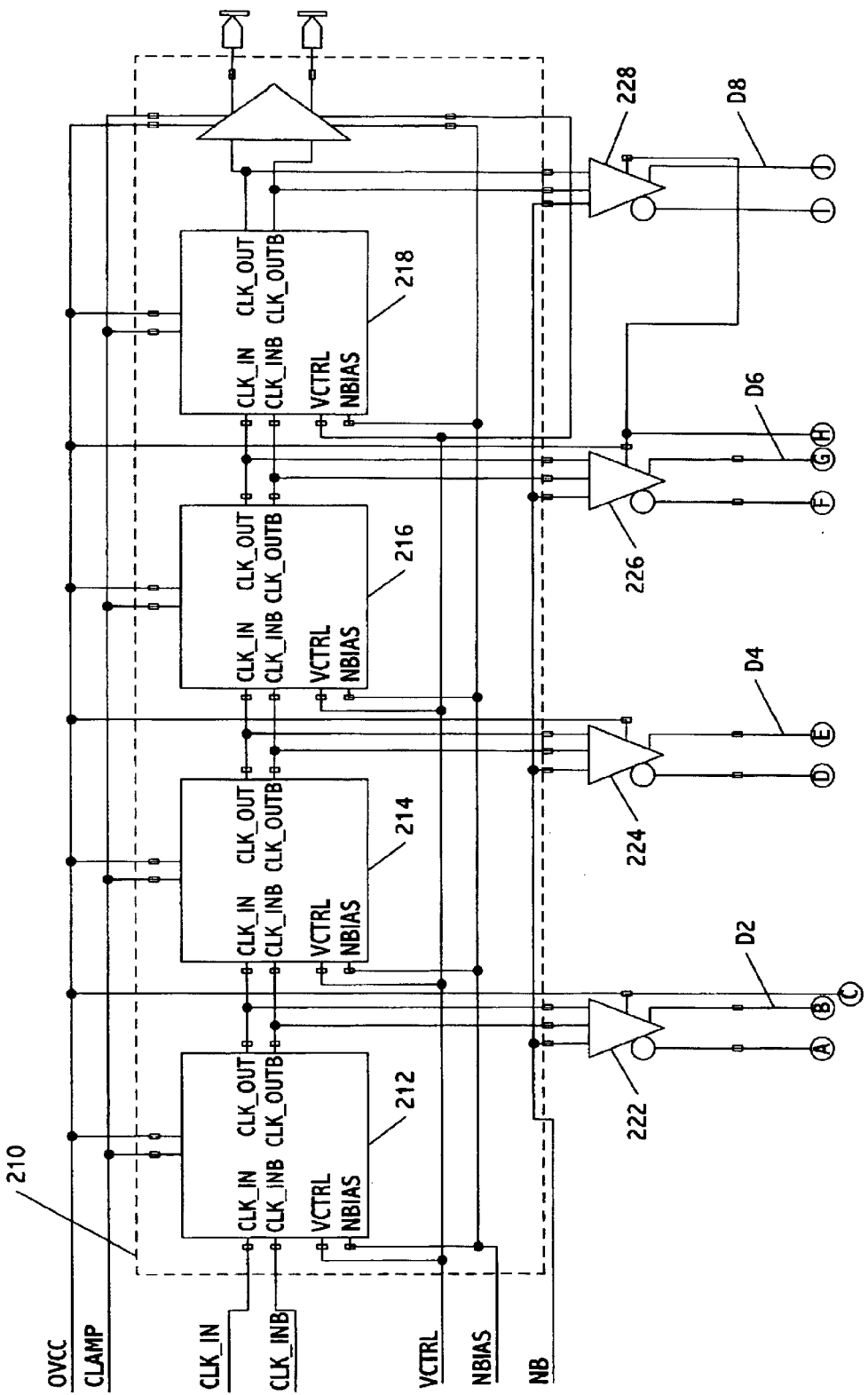
FIGS. 9(a) and 9(b) are diagrams showing the manner in which a programmable delay controller may be connected to the slow-fast detector and edge-shaping circuitry for 2× clock generation in accordance with one embodiment of the present invention.
Figure 9B:
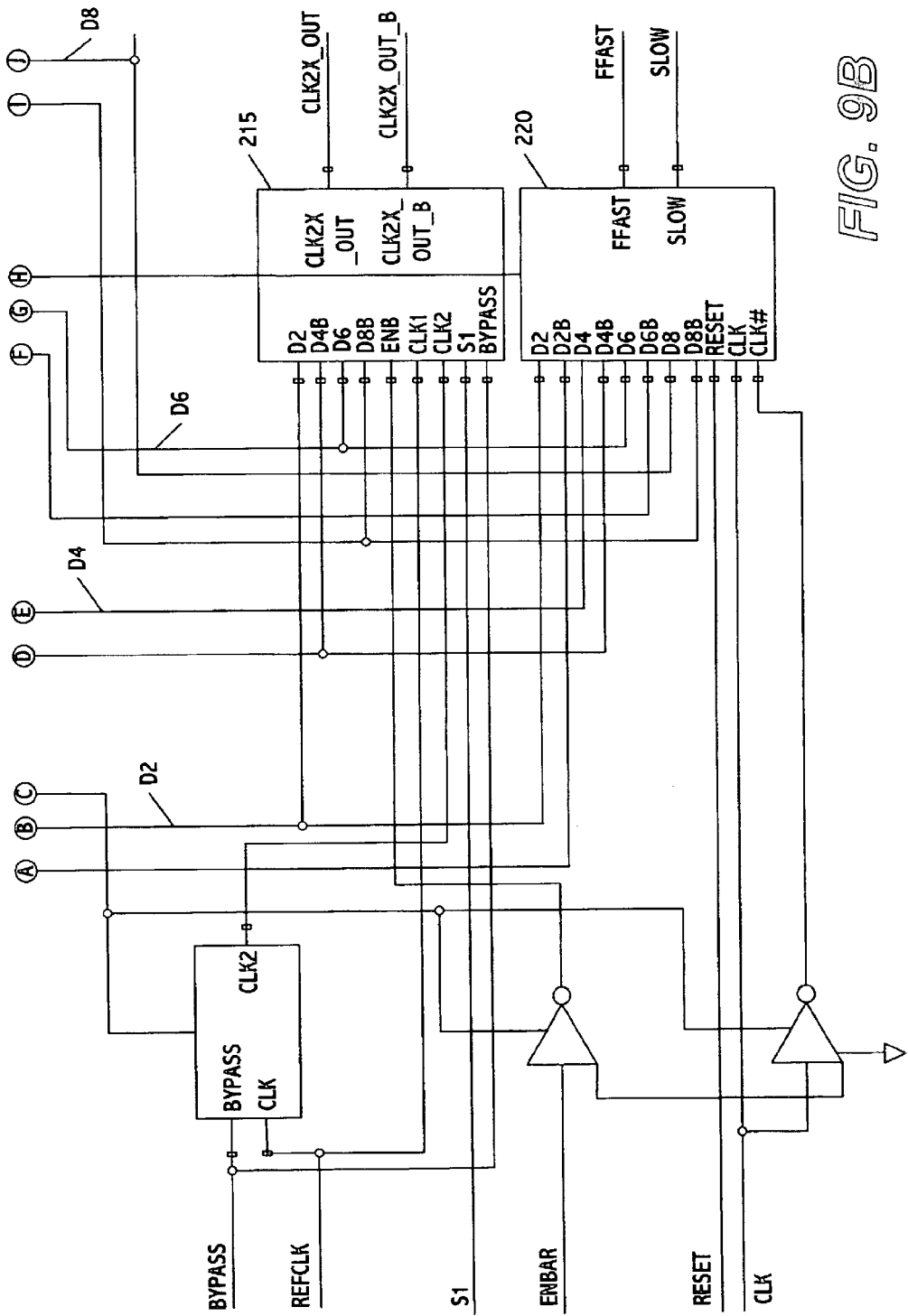

FIG. 9(a) and FIG. 9(b) show the manner in which the programmable delay controller may be electrically coupled to the slow-fast detector 218 and edge-shaping circuitry 215 for 2× clock generation. Here, the programmable delay unit 210 is shown as including four delay elements 212, 214, 216, and 218 connected in series to form a voltage-controlled delay chain. The first delay element receives the input clock signal $CK_{in}$, for example, through unit 150. The delay of each delay element is monotonically dependent on the control signal $V_{ctrl}$, which is generated by the control generator in response to the phase difference detected by the phase detector or, in override mode, the fast or slow detection signals output from the slow-fast detector. The control generator generates signal $V_{ctrl}$ in order to adjust the delay in the programmable delay unit to delay the input clock signal by an amount which will reduce or altogether eliminate the phase difference between the input and output clock signals. Delay units 210 may be any one of a number of voltage-controlled delay chains conventionally known but modified in accordance with the present invention to provide the phase-delay information signals at the multiple points in the chain.

In accordance with the present invention, delay indication information is generated by the programmable delay unit for input into the slow-fast detector 220. In this embodiment, the delay indication information is generated based on the combined output of logic gates respectively connected to the delay elements. The manner in which this information is generated depends on phase-delay point assignments which will now be discussed.

Each of the delay elements is assigned one of four phase-delay points after DLL locking is achieved. As an example, analog-to-logic level shifter 222 (which maybe a differential amplifier) generates a signal based on the output of delay element 212. This signal indicates that the input clock signal has been delayed in phase to 90-degrees after the DLL has been locked, or equivalently that the input clock signal has been delayed by up to ¼ of the delay chain. Circuit 224 generates a signal based on the output of delay element 214. This signal indicates that the input clock signal has been delayed an additional 90 degrees, and when taken in combination with the output from element 222 provides an indication of a total delay to that point in the chain of up to 180 degrees, or equivalently that the input clock signal has been delayed by up to ½ of the delay chain. Logic gate 226 generates a signal based on the output of delay element 216. This signal indicates that the input clock signal has been delayed an additional 90 degrees, and when taken in combination with the outputs from elements 222 and 224 provides an indication of a total delay to that point in the chain of up to 270 degrees, or equivalently that the input clock signal has been delayed by up to ¾ of the delay chain. Finally, logic gate 228 generates a signal based on the output of delay element 218. This signal indicates that the input lock signal has been delayed an additional 90 degrees, and when taken in combination with the outputs from the other gates provides an indication of a total delay of up to 360 degrees (or a full period), or that the input clock signal has been delayed by the entire delay in the chain.

The combined output of the logic gates shown in FIG. 9(a) thus forms phase delay indication information which indicates an amount of delay of the input clock signal. While four delay elements are shown in this illustrative embodiment, those skilled in the art can appreciate that the DLL circuit of the present invention may be implemented based on a different number of delay elements and corresponding phase-delay signal generating gates. Also, in FIG. 9(a), each of the delay elements are said to provide a delay of a certain amount after DLL lock, since the delay chain preferably has a one-period (360 degree) delay and each block provides ¼ of the total delay of the chain.

Figure 10:
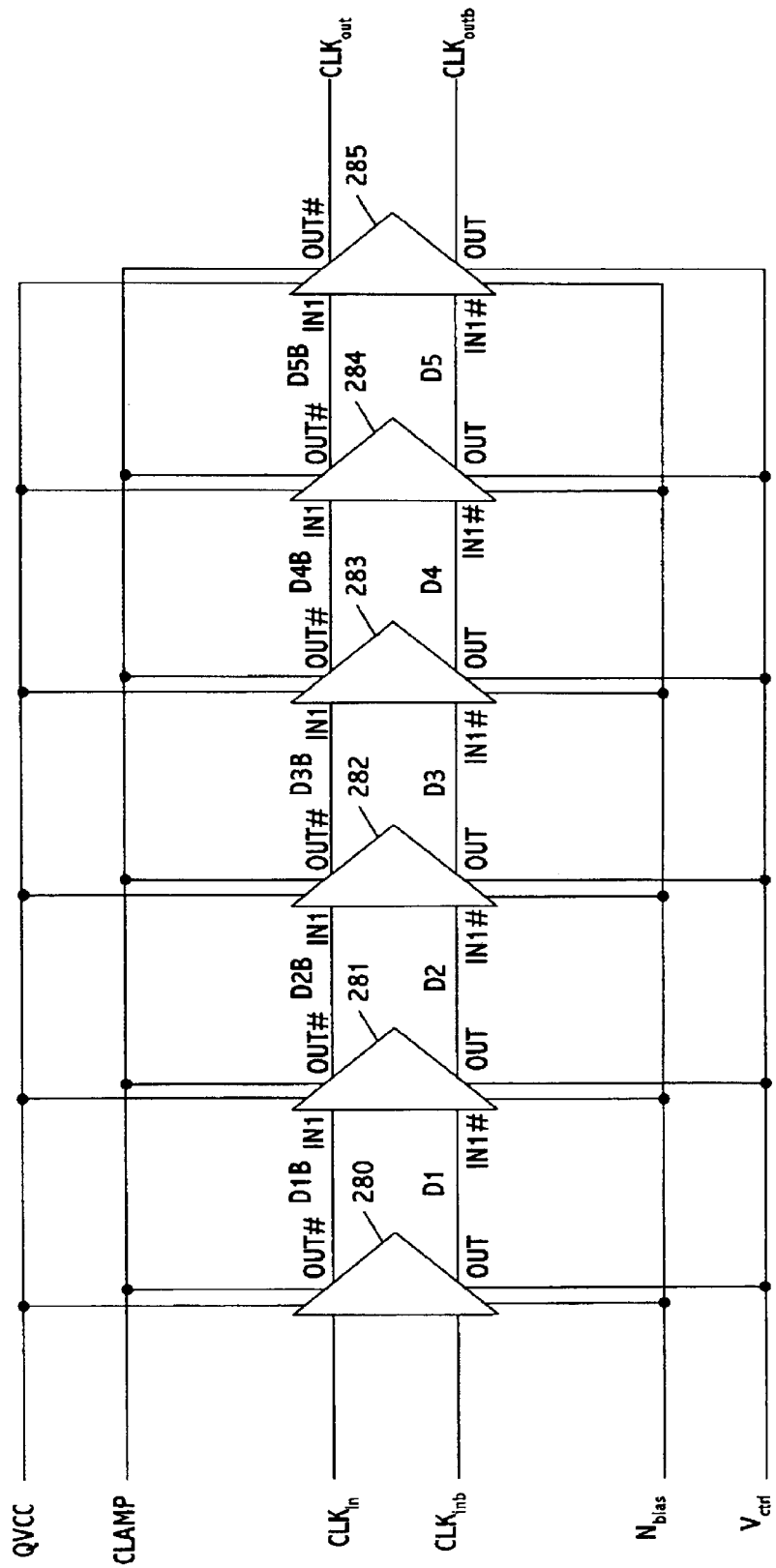
FIG. 10 is a timing diagram showing phase quadrants (or phase-delay points) to which each of the delay elements in the programmable delay unit of FIG. 9(a) is assigned.

FIG. 10 shows that each delay element may include an internal chain of differential delay elements. In this nonlimiting example, six differential delay elements 280–285 are included, each of which is responsible for delaying an input clock signal by 15 degrees. When all six differential elements are activated, the output clock signal clk_out is delayed by a cumulative amount of 90 degrees relative to the input clock signal clk_in. Further, activation of each of the differential delay elements may be controlled by an analog voltage signal $V_{control}$ output from the control generator. More specifically, since the delay chain is a voltage-controlled delay chain, it is understood that the value of the voltage signal $V_{ctrl}$ determines how much delay each delay element will impose.

Figure 11:
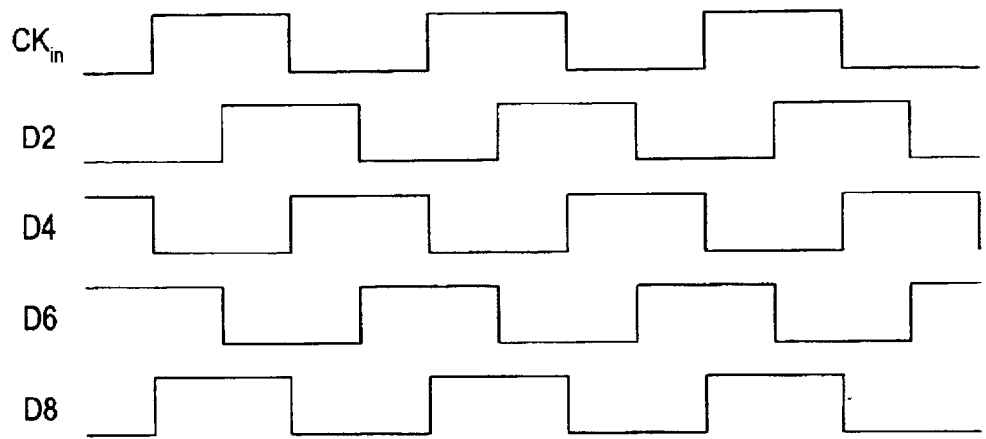
FIG. 11 is a diagram showing an example of a delay range which may be used in accordance with the present invention for purposes of defining an out-of-bounds condition.

FIG. 11 is a timing diagram which provides an indication of how the input clock signal is delayed at each point in the delay chain. Here, d2 (output from gate 222) indicates that the input clock signal has been delayed by 90 degrees, d4 (output from gate 224) indicates that a delay of 180 degrees has been imposed, d6 (output from gate 226) indicates that a delay of 270 degrees has been imposed, and d8 (output from gate 228) indicates that a delay of 360 degrees has been imposed. D2, d4, d6, and d8 may therefore be said to correspond to phase-delay assignment (or quadrant-delay) points within the programmable delay unit.

The slow-fast detector 230 generates a detection signal which provides an indication of whether the phase delay between the input and output clock signals lies outside a predetermined delay range. (As previously indicated, this range may indicate, for example, whether a out-of-bounds or excessive phase-error condition has occurred.) The detection signal is generated based on the phase delay indication information output from the programmable delay unit. This may be accomplished in the following manner.

The slow-faster detector outputs one of two signals depending on the phase-delay information output from the programmable delay unit. Which signal is output depends on whether the phase delay between the input and output clock signals lies outside a predetermined delay range. The limits of this range maybe selected depending on the particular application of the DLL circuit. Preferably, the limits are set to define a delay range narrower than a conventional two-input phase detector can cover. If desired, however, this range may be set to encompass different ranges including ones that are broader than a conventional detector can cover. In any event, the limits of the range are preferably set in the slow-fast detector.

Figure 12:
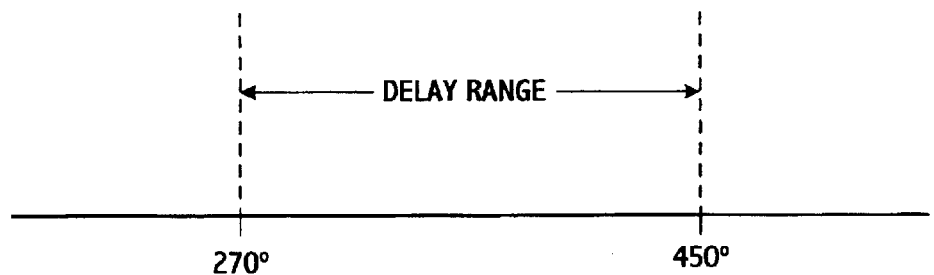
FIG. 12 is a diagram showing another example of a delay range which may be used in accordance with the present invention for purposes of defining an out-of-bounds condition.

FIG. 12 shows an example of a delay range that maybe used in accordance with the present invention. Here, the lower limit of the delay range is set to a value corresponding to a delay of 270 degrees and the upper limit is set to a value corresponding to a delay of 450 degrees. Using these limits, the slow-fast detector will output a slow signal when the delay indication information output from the programmable delay unit indicates that the total delay in unit 210 (i.e., the phase delay between the input and output clock signals) is below 270 degrees. On the other hand, the slow-fast detector will output a fast signal when the delay indication information output from the programmable delay unit indicates that the total delay is above 450 degrees. These limits (270 degrees, 450 degrees) maybe implemented with proper selections of signals from the delay chain. In the example under consideration, more relaxed limits are set.

Figure 13:
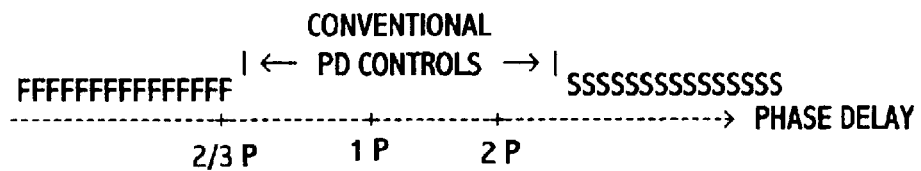
FIG. 13 is a circuit diagram showing how each of the delay elements in the programmable delay unit of FIG. 9(a) may be constructed.

FIG. 13 shows another example of a delay range used in accordance with the present invention. Here, the lower limit of the range is set to a value corresponding to 2/3 P, where P represents a clock period. The upper limit of the range is set to a value corresponding to 2 P. Using these limits, the slow-fast detector will output a fast signal when the delay indication information output from the programmable delay unit indicates that the total delay in unit 210 (i.e., the phase delay between the input and output clock signals) is below 2/3 P. On the other hand, the slow-fast detector will output a slow signal when the delay indication information output from the programmable delay unit indicates that the total delay is above 2 P for 50% duty cycle of $CK_{in}$.

Figure 14A:
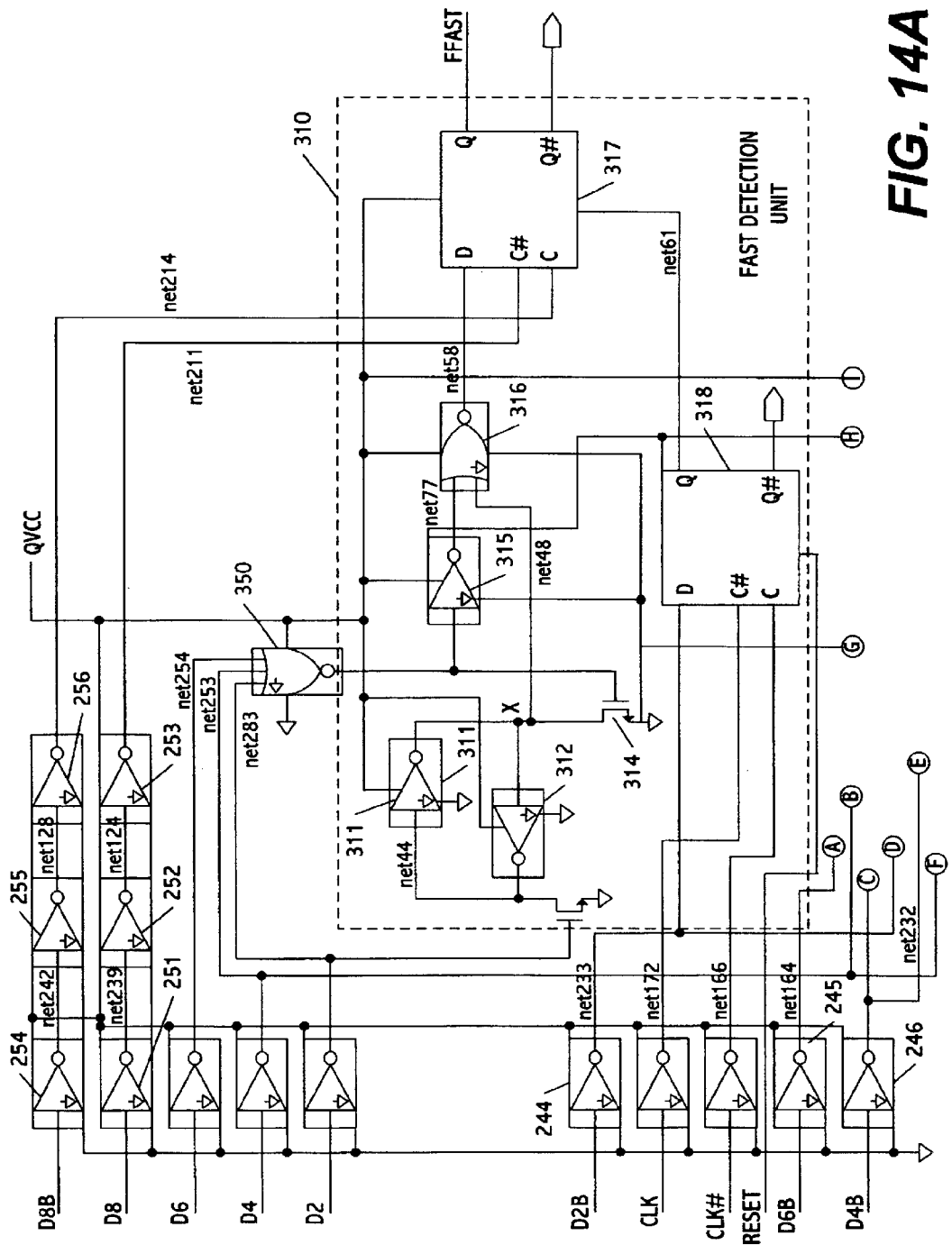
FIGS. 14(a) and 14(b) are diagrams showing an example of how the slow-fast detector of the present invention may be constructed in accordance with one embodiment of the present invention.
Figure 14B:
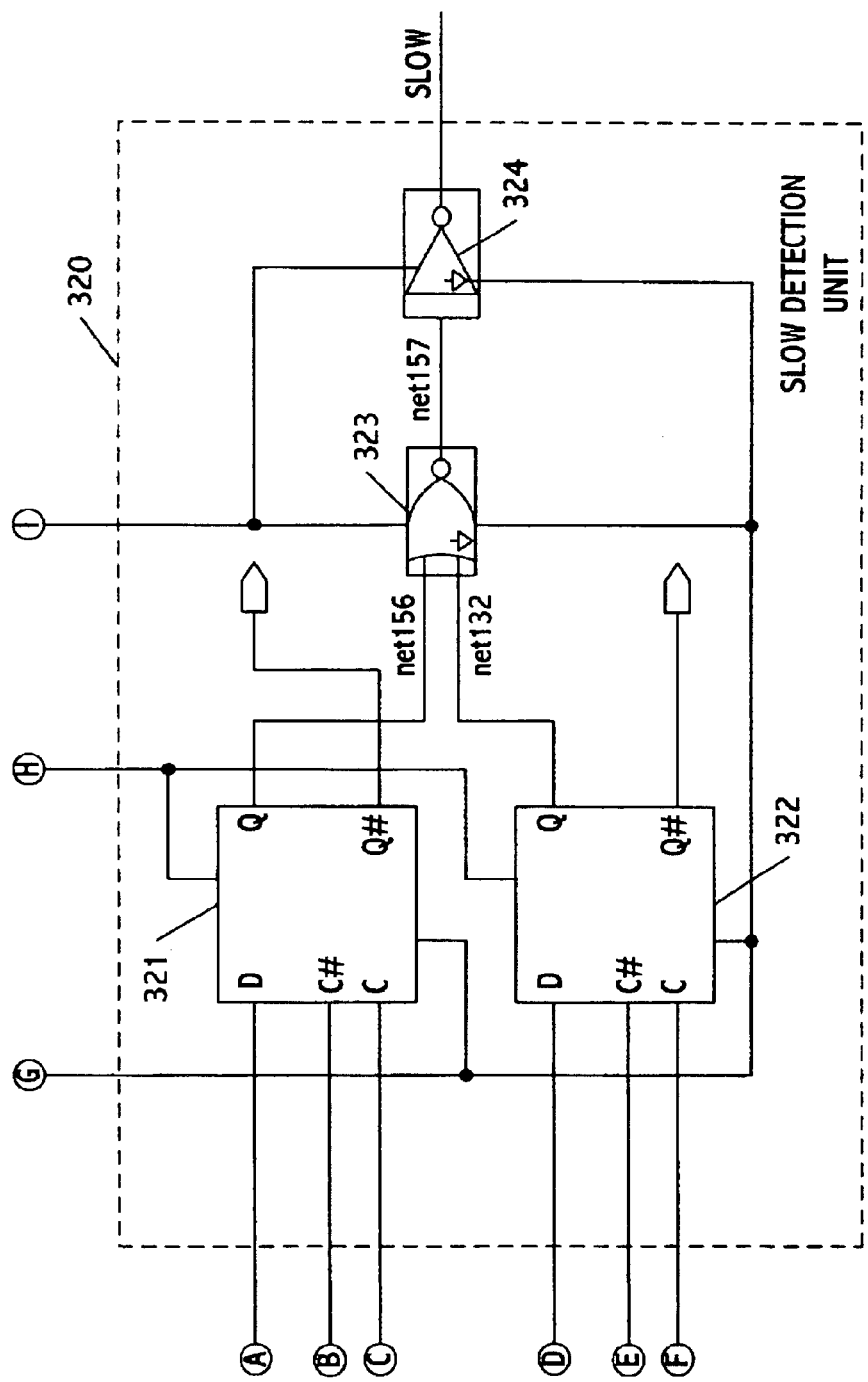

FIG. 14(a) and FIG. 14(b) show an example of how the slow-faster detector maybe implemented using digital circuitry. The detector includes a unit 310 for generating a fast detection signal, a unit 320 for generating a slow detection signal, and control logic for controlling each. The fast and slow detection units are coupled to receive delay indication information from the programmable delay unit along selected ones of input pins d2, d4, d6, and d8. These pins correspond to the same-numbered pins shown in detector 220 of FIG. 9(b), and thus are connected to respectively receive delay indication information from logic gates 222, 224, 226, and 228 in the programmable delay unit. Selected ones of input pins d2, d4, and d6 and their complements are connected to the fast and slow detection units through inverters 241–246. Input pin d8 is connected to the fast detection circuit through three series-connected inverters 251–253, and the complement of d8 is connected to the same unit through inverters 254–256.

The fast detection unit includes a latch for noise filtering which includes inverters 311 and 312 and transistors 313 and 314, an inverter 315, a NOR gate 316, and a flip-flop 317. The fast detection circuit also includes a second flip-flop 318 for controlling the resetting of flip-flop 317. In addition to forming a latch, inverters 311 and 312 may be said to form a keeper circuit for controlling the voltage at node X.

The slow detection unit includes two flip-flops 321 and 322, a NOR gate 323 connected to receive the outputs of these flip-flops, and an inverter 324 for inverting the output of the NOR gate. While the flip-flops in the fast and slow detection units are shown as D flip-flops, those skilled in the art can appreciate that other flip-flops or latch-type circuits may be used.

A logic gate 350 is connected to pins d2, d4, and d6 through their respective inverters. The output of this gate maybe used to control when the fast detection signal is output from the slow-fast detector. While logic gate 350 is shown as a NOR gate, those skilled in the art can appreciate that different logic may be used to control the output of the fast detection signal.

In operation, the slow-fast detector outputs one of a fast detection signal and a slow detection signal to the phase detector based on the amount the input clock signal is delayed by the programmable delay unit. The amount of delay is conveyed to the slow-fast detector through the phase-delay indication information input from pins d2, d4, d6, and d8 and their complements. The slow-fast detector then determines whether excessive phase error exists based on information from these pins and a slow or fast detection signal is output accordingly. As previously indicated, the phase-delay points for the pins (delay elements) correspond to cases where ¼, ½, ¾, and the entire output of the delay chain has been activated.

FIGS. 15A and 15B provide an example of how the slow-fast detector may detect whether excessive phase error exists between input and output clock signals. As previously discussed, excessive phase error maybe determined by comparing the delay between the input and output clock signals to a predetermined range. In the example under consideration, the case where the delay is 90 degrees (within range) and 450 degrees (outside range) is given. If there is 90-degrees total delay in the delay chain, the signal voltages for pins d2, d4, d6, and d8 correspond to a logical 1 and maybe appear in the manner shown in FIG. 15A relative to the input clock signal. (It is understood that some time difference may exist between the time the signal voltages are generated and detected by the slow-fast detector.) If there is 450-degrees total delay, pin d8 would be in phase as the 90-degrees case. However, the signal voltages of pins d6 and d4 would be different, e.g., d8 and d 2 are 1 but d6 and d4 are 0 as shown in FIG. 15B. In the timing diagrams of FIGS. 15A and 15B, it is noted that as time goes on, the corresponding outputs of the pins are derived by moving the arrows in FIGS. 15A and 15B from right to left.

The difference in pin values, thus, provides a detectable basis upon which the slow-fast detector can rely in determining whether the phase error exists outside a predetermined range considered to be excessive. For example, all four pin values are the same for most of the time in FIG. 15A, while all four pin values will not be the same when an excessive phase-error condition exists, as shown in FIG. 15B. By observing the values of the pins from properly chosen points (quadrants in the example implemented), the threshold limits of the range of the slow-fast detector maybe set. The manner in which the fast and slow detection signals are generated based on the phase-delay information output from these pins will now be discussed.

The case where the total amount of delay to be imposed on the input clock signal is less than one period of the delay chain will now be discussed. When pin d2 is 0, node X is set to a logical value of 1 and the output of gate 316 is set to 0. This corresponds to a situation similar to a reset status of the latch formed from inverters 311 and 312. When pins d2, d4, and d6 are 1, then the output of gate 350 is 1 and node X is set to 0. Also, inverter 315 outputs a 0 and the output of gate 316 is 1. Now, if the clock input of flip-flop 317 (i.e., inverted pin d8B) is rising (or equivalently d8 is rising) when gate 316 is 1, FAST is set to 1. Thus, the fast detection signal is set at the rising edge of d8 when d2, d4, and d6 are 1. To satisfy this condition, delay from the ¼ point of the delay chain output are all 1. This means ¾ of the total delay is less than ⅔ for the input clock period for the case of a 50% duty cycle. In other words, when the total delay is less than ⅔ period, which is ½ divided by ¾, then the fast detection signal is output from the slow-fast detector. Note that the fast detection signal is updated only at the rising edge of d8. At the rising edge of d8, if any of d2, d4, and d6 are 0, then FAST is set to 0 (i.e., the fast detection signal is not output).

The case where the total amount of delay to be imposed on the input clock signal is more than one clock period or multiple clock periods will now be discussed. When the total delay meets this condition, d8 rises when d2, d4, and d6 all have a value of 1. Thus, when signal clk rises, if inverter 244 (which inverts the complement of d2, e.g., d2b) is 1 (equivalently, if d2 is 1), then flip-flop 318 is set to 1 in order to reset flip-flop 317. In this example, the clock is about 90 degrees ahead of the clock input of the delay chain. When the DLL locks, the delay between clk to d2 is about 180 degrees. So, if flip-flop 318 is set to 1, there is at least one clock period delay between clk to d2. In other words, delay with at least two clock periods in the chain and FAST should never be set to 1, so the flip-flop may be reset.

Operation of the slow detection unit will now be discussed. Since NOR gate 323 and inverter 324 performs a logical OR function, the slow detection signal is output from the slow-fast detector (e.g., is set to 1) when the output of either of two flip-flops 321 and 322 is 1. Flip-flop 321 is set to 1 at the rising edge of d4 when d6 is 1. Flip-flop 322 is set to 1 at the falling edge of d4 when d2 is 1. Note that the delay between d4 to d6 and d2 to d4 are both ¼ of the total delay of the delay chain. To set the flip-flops, at least a ½ period delay should occur inside of ¼ of the delay chain. This means there are two clock periods or more delay at the delay chain, thereby resulting in output of the slow detection signal (e.g., SLOW is set to 1).

The slow-fast detector was described above for the case where the duty cycle of the input clock signal is 50%. Those skilled in the art can appreciate that the slow-fast detector may be modified to operate using other duty cycles, including but not limited to duty cycles lying in a range of between 25% and 75%.

Figure 16:
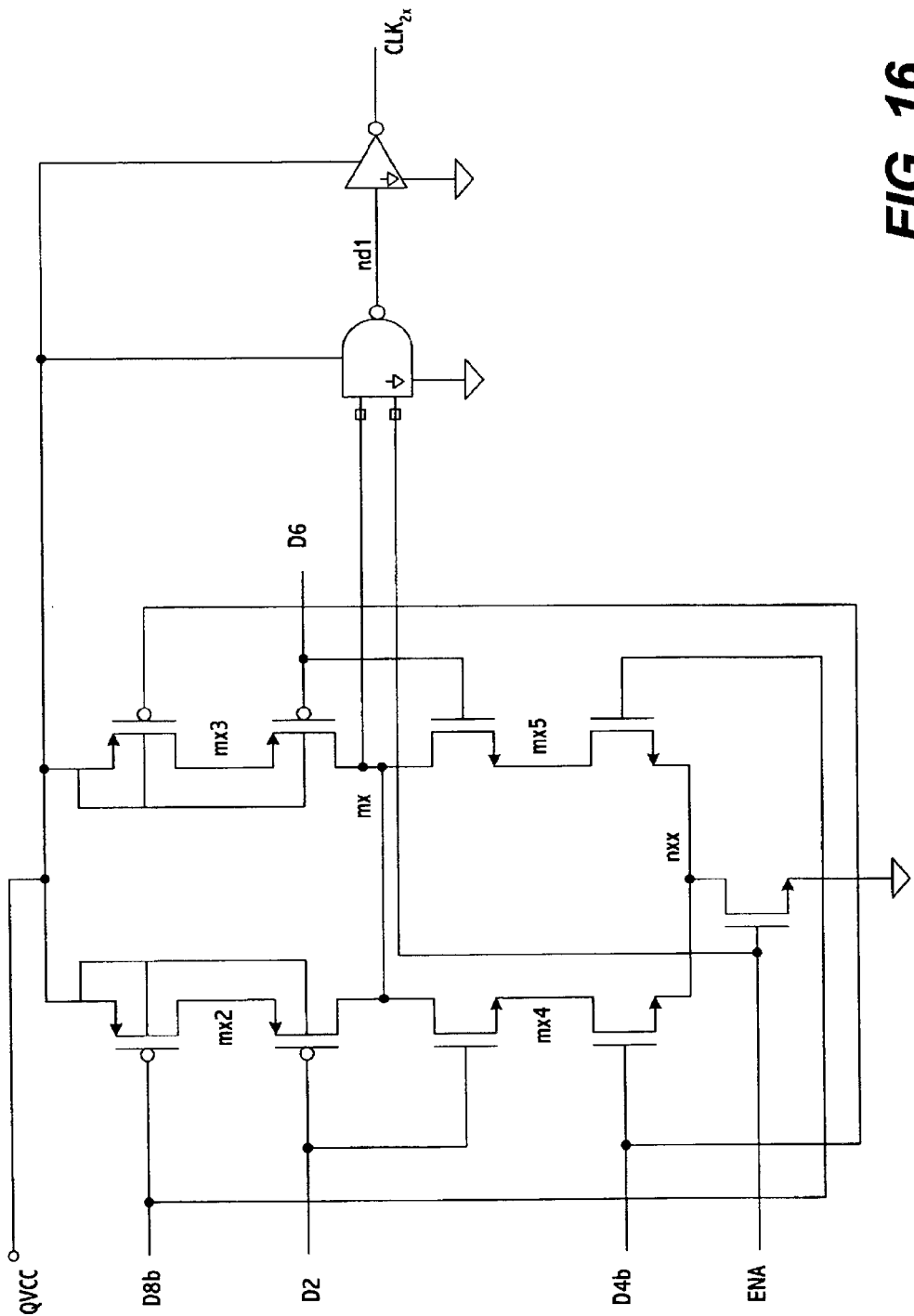
FIG. 16 is a circuit diagram of a clock multiplier which may be used in accordance with the DLL of the present invention for purposes of generating a 2× clock signal.
Figure 17:
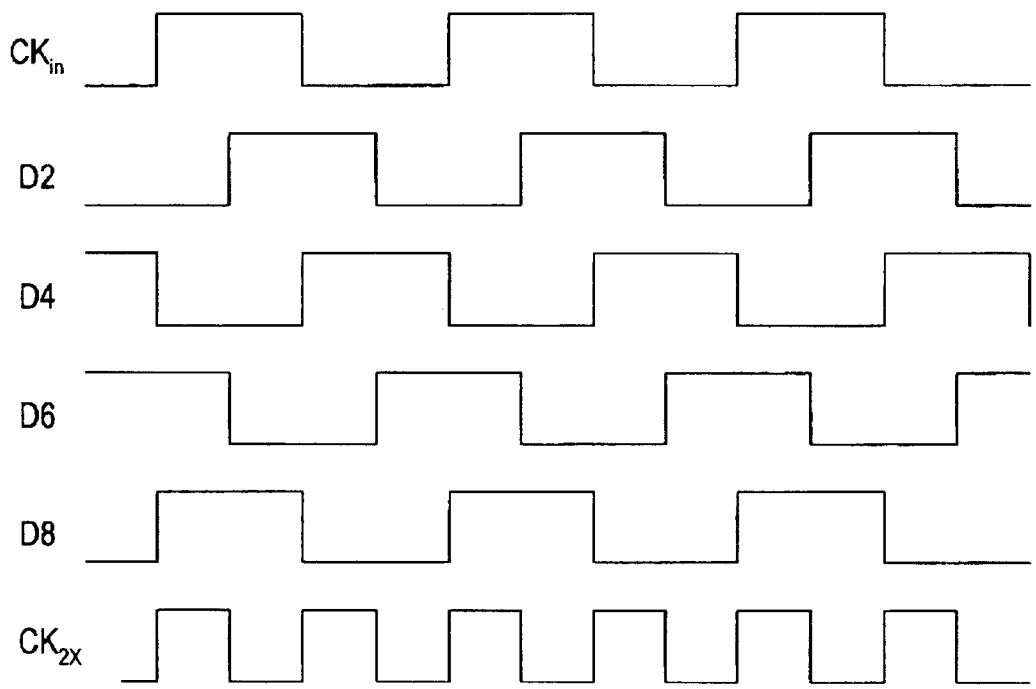
FIG. 17 is a timing diagram showing waveform inputs of the clock multiplier of FIG. 15 and the resulting 2×-multiplied clock signal

The DLL circuit of the present invention may include a number of optional features. For example, in FIG. 9(b), edge shaping circuitry 280 maybe included for 2× clock generation. This circuitry includes a clock multiplier such as set forth in FIG. 16, where d2, d4, d6, and d8 correspond to the output of phase-delay points corresponding to ¼, ½, ¾, and an entire delay of the programmable delay unit respectively under conditions where the DLL is locked. In this circuit, ena is an enable signal and the output corresponds to the following logic. Clock signal CLK2× is equal to 1 when d2=0 and d8=1 or when d4=1 and d6=0, and CLK2× is equal to 0 when d2=1 and d4=0 or when d6=1 and d8=0. FIG. 17 shows a timing diagram showing the state of signals d2, d4, d6, and d8 for generating the CLK2× output.

Figure 18:
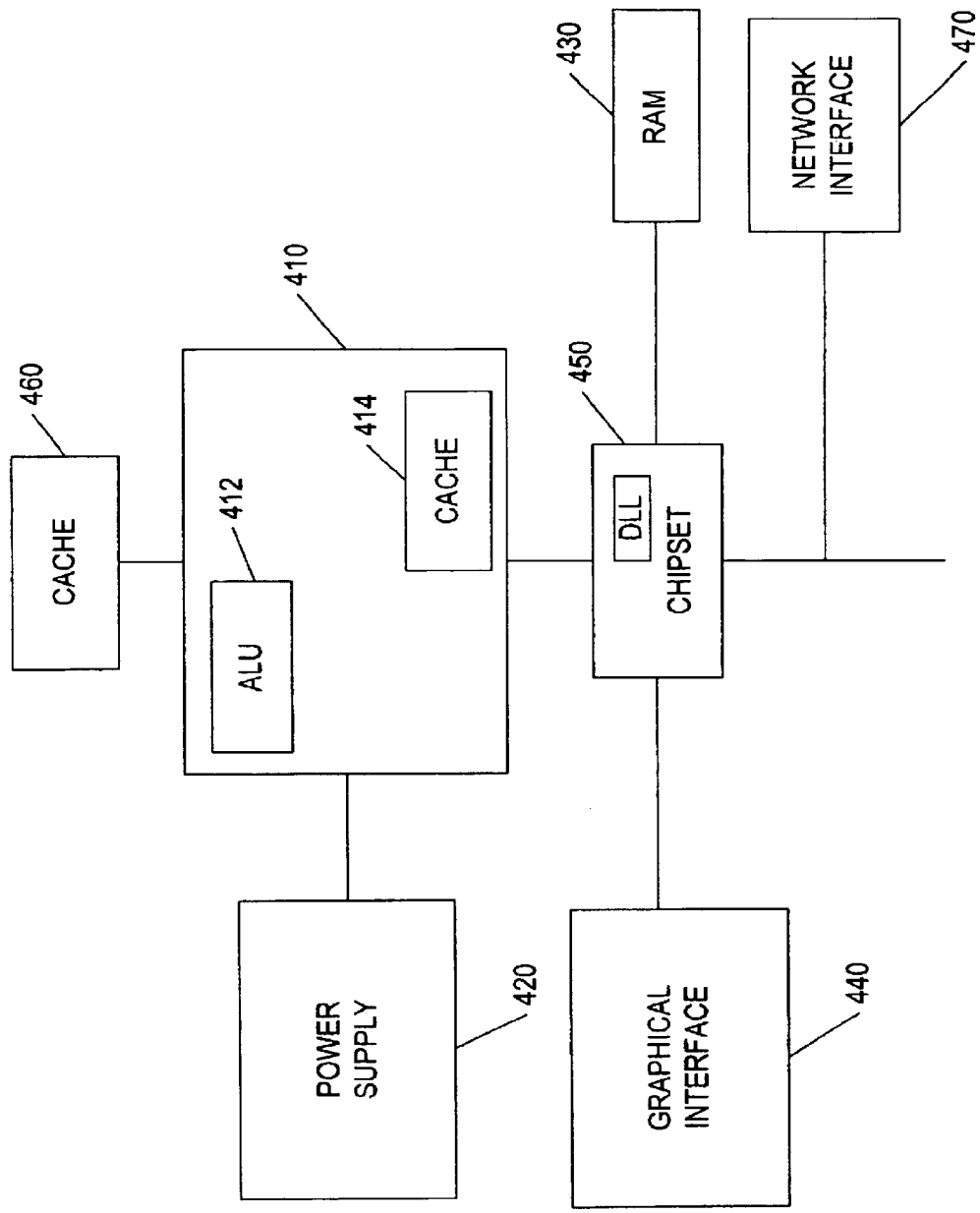
FIG. 18 is a diagram showing a processing system which may included a DLL circuit in accordance with any of the embodiments of the present invention.

FIG. 18 shows a processing system which includes a processor 410, a power supply 420, and a memory 430 which, for example, maybe a random-access memory. The processor may include an arithmetic logic unit 412 and an internal cache 414. In addition to these elements, the processing system may optionally include a graphical interface 440, a chipset 450, a cache 460 and a network interface 470. The DLL circuit of the present invention maybe used to generate timing and/or clock signals for controlling operations of the chipset or processor, or for controlling the transfer of data between either of these elements and the memory. Those skilled in the art can appreciate that these applications are only illustrative, as the DLL of the present invention may be applied in such a processing system to generate any type of timing or clock signals required.

Other modifications and variations to the invention will be apparent to those skilled in the art from the foregoing disclosure. Thus, while only certain embodiments of the invention have been specifically described herein, it will be apparent that numerous modifications maybe made thereto without departing from the spirit and scope of the invention.

I claim:

1. A delay-locked loop, comprising:
   a delay unit which generates an output frequency signal by delaying an input frequency signal;
   a range detector responsive to the delay unit to detect whether a phase error between the input frequency signal and the output frequency signal exceeds a predetermined range; and
   a delay controller which controls the delay unit to adjust delay of the input frequency signal by an amount which reduces said phase error based on an output of the range detector.

2. The delay-locked loop of claim 1, wherein the predetermined range exceeds one period of the input frequency signal.

3. The delay-locked loop of claim 2, wherein the predetermined range includes multiple periods of the input frequency signal.

4. The delay-locked loop of claim 1, wherein, when the range detector detects that said phase-error exceeds the predetermined range, the delay controller controls the delay unit to adjust the delay of the input frequency signal until said phase error is within the predetermined range.

5. The delay-locked loop of claim 1, further comprising:
a phase detector which detects a phase difference between the input frequency signal and the output frequency signal; and
an override controller which disables the phase detector based on a correction signal output from the range detector indicating that said phase error exceeds the predetermined range, wherein the phase detector is coupled to an input of the delay controller.

6. The delay-locked loop of claim 5, wherein the override controller generates a delay-adjustment signal for increasing or decreasing the delay of the input frequency signal based on the signal output from the range detector, and wherein the delay controller controls the delay unit to adjust the delay of the input frequency signal based on the delay-adjustment signal from the override controller.

7. The delay-locked loop of claim 6, wherein, when the range detector detects that said phase-error is within the predetermined range, the override controller activates the phase detector and the delay controller controls the delay unit to adjust the delay of the input frequency signal based on a signal output from the phase detector.

8. The delay-locked loop of claim 5, wherein the predetermined range is determined based on at least one operating limit of the phase detector.

9. The delay-locked loop of claim 1, wherein said amount of delay causes a period of the output frequency signal to be synchronized with a period of the input frequency signal.

10. The delay-locked loop of claim 1, wherein the range detector detects that said phase error exceeds the predetermined range based on phase-delay information output from the delay unit.

11. The delay-locked loop of claim 10, wherein the delay unit includes a plurality of delay elements which collectively impose a predetermined total delay, and wherein the phase-delay information indicates what portion of said predetermined total delay is imposed on the input frequency signal by the plurality of delay elements.

12. The delay-locked loop of claim 11, wherein the predetermined total delay corresponds to a span of time based on a period and a duty cycle of the input clock signal.

13. A controller for controlling a delay-locked loop, said loop including a delay unit which generates an output frequency signal by delaying an input frequency signal and a phase detector which detects a phase difference between the input and output frequency signals, said controller comprising:
a range detector responsive to the delay unit to detect whether a phase error between the input and output frequency signal exceeds a predetermined range; and
a delay controller which controls the delay unit to adjust delay of the input frequency signal by an amount which reduces said phase error based on an output of the range detector.

14. The controller of claim 13, wherein the predetermined range exceeds one period of the input frequency signal.

15. The controller of claim 13, wherein, when the range detector detects that said phase-error exceeds the predetennined range, the delay controller controls the delay unit to adjust the delay of the input frequency signal until said phase error is within the predetermined range.

16. The controller of claim 13, further comprising:
an override controller which disables the phase detector based on a signal output from the range detector indicating that said phase error exceeds the predetermined range.

17. The controller of claim 16, wherein the override controller generates a delay-adjustment signal for increasing or decreasing the delay of the input frequency signal based on the signal output from the range detector, and wherein the delay controller controls the delay unit to adjust the delay of the input frequency signal based on the delay-adjustment signal from the override controller.

18. The controller of claim 17, wherein, when the range detector detects that said phase-error is within the predetermined range, the override controller activates the phase detector and the delay controller controls the delay unit to adjust the delay of the input frequency signal based on a signal output from the phase detector.

19. The controller of claim 17, wherein the predetermined range is determined based on operating limits of the phase detector.

20. The controller of claim 13, wherein the range detector detects that said phase error exceeds the predetermined range based on phase-delay information output from the delay unit.

21. A method for generating frequency signals in a delay-locked loop, comprising:
delaying an input frequency signal to produce an output frequency signal;
comparing a phase error between the input frequency signal and output frequency signal to a predetermined range; and
adjusting delay of the input frequency signal based on the range comparison.

22. The method of claim 21, wherein the predetermined range exceeds one period of the input frequency signal.

23. The method of claim 21, wherein, when the range comparison indicates that said phase error exceeds the predetermined range, the delay adjustment includes adjusting the input frequency signal until said phase error is within the predetermined range.

24. The method of claim 23, wherein, when the range comparison indicates that said phase error exceeds the predetermined range, the delay adjustment includes disabling a phase detector for allowing the delay of the input frequency signal to be adjusted.

25. The method of claim 23, wherein, when said phase-error is within the predetermined range, the phase detector is enabled and the delay adjustment includes adjusting the delay of the input frequency signal based on an output of the phase detector.

26. The method of claim 21, wherein the predetermined range is determined based on at least one operating limit of the phase detector.

27. A processing system, including:
a processor; and
a frequency generator which generates signals for controlling at least one operation of the processor; said frequency generator including:
a delay unit which generates an output frequency signal by delaying an input frequency signal;
a range detector responsive to the delay unit to detect whether a phase error between the input frequency signal and the output frequency signal exceeds a predetermined range; and
a delay controller which controls the delay unit to adjust delay of the input frequency signal by an amount which reduces said phase error based on an output of the range detector.

28. The processing system of claim 27, wherein the predetermined range exceeds one period of the input frequency signal.

* * * * *